United States Patent
Otake et al.

(10) Patent No.: US 9,548,292 B2
(45) Date of Patent: Jan. 17, 2017

(54) CIRCUIT INCLUDING A RESISTIVE ELEMENT, A DIODE, AND A SWITCH AND A METHOD OF USING THE SAME

(71) Applicant: Semiconductor Components Industries, LLC, Phoenix, AZ (US)

(72) Inventors: Seiji Otake, Kumagaya (JP); Yasuhiro Takeda, Ogaki (JP); Yuta Miyamoto, Souka (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 80 days.

(21) Appl. No.: 14/279,410

(22) Filed: May 16, 2014

(65) Prior Publication Data

US 2014/0247527 A1    Sep. 4, 2014

Related U.S. Application Data

(62) Division of application No. 13/612,357, filed on Sep. 12, 2012, now abandoned.

(30) Foreign Application Priority Data

Sep. 27, 2011    (JP) .................................. 2011-210198

(51) Int. Cl.
    H01L 27/02    (2006.01)
    H01L 27/06    (2006.01)
(52) U.S. Cl.
    CPC ....... *H01L 27/0248* (2013.01); *H01L 27/0251* (2013.01); *H01L 27/0255* (2013.01); *H01L 27/0259* (2013.01); *H01L 27/0647* (2013.01)
(58) Field of Classification Search
    CPC ............. H01L 27/0248; H01L 27/0259; H01L 27/0255; H01L 27/0277; H01L 27/0251
    See application file for complete search history.

(56) References Cited

U.S. PATENT DOCUMENTS

| | | | |
|---|---|---|---|
| 4,405,933 A | 9/1983 | Avery | |
| 4,872,039 A | 10/1989 | Stabile | |

(Continued)

FOREIGN PATENT DOCUMENTS

| | | | |
|---|---|---|---|
| JP | S57-154879 A | 9/1982 | |
| JP | H05-048007 A | 2/1993 | |

(Continued)

OTHER PUBLICATIONS

Machine translation of JP 05-090481, translated Mar. 31, 2015.*

(Continued)

*Primary Examiner* — Zandra Smith
*Assistant Examiner* — Lauren R Bell
(74) *Attorney, Agent, or Firm* — Abel Law Group, LLP

(57) ABSTRACT

An ESD protection element can have a high ESD protection characteristic which has a desired breakdown voltage and flows a large discharge current. A junction diode is formed by an N+ type buried layer having a proper impurity concentration and a P+ type buried layer. The P+ type buried layer is combined with a P+ type drawing layer to penetrate an N– type epitaxial layer and be connected to an anode element. An N+ type diffusion layer and a P+ typed diffusion layer connected to an surrounding the N+ type diffusion layer are formed in the N– epitaxial layer surrounded by the P+ type buried layer etc. The N+ type diffusion layer and P+ type diffusion layer are connected to a cathode electrode. An ESD protection element is formed by the PN junction diode and a parasitic PNP bipolar transistor which uses the P+ type diffusion layer as an emitted, the N– type epitaxial layer as the base, and the P+ type drawing layer etc. as the collector.

17 Claims, 8 Drawing Sheets

(56) References Cited

U.S. PATENT DOCUMENTS

| | | | |
|---|---|---|---|
| 4,888,623 A * | 12/1989 | Enomoto et al. ............. | 257/476 |
| 5,223,737 A * | 6/1993 | Canclini ....................... | 257/546 |
| 5,336,920 A | 8/1994 | Jimenez | |
| 5,545,909 A | 8/1996 | Williams et al. | |
| 5,708,289 A | 1/1998 | Blanchard | |
| 6,385,021 B1 | 5/2002 | Takeda et al. | |
| 2004/0004762 A1 | 1/2004 | Bruehl et al. | |
| 2009/0206376 A1* | 8/2009 | Mita ................... | H01L 29/7322 |
| | | | 257/288 |
| 2013/0075866 A1 | 3/2013 | Otake et al. | |

FOREIGN PATENT DOCUMENTS

| | | |
|---|---|---|
| JP | 5-90481 | 4/1993 |
| JP | H06-140576 A | 5/1994 |
| JP | 6-177328 | 6/1994 |
| JP | 2004-078162 A | 3/2004 |
| JP | 2004-266044 A | 9/2004 |
| JP | 2006-128293 | 5/2006 |

OTHER PUBLICATIONS

Colclaser, Roy A., "Microelectronics: Processing and Device Design," Crystal Growth and Epitaxy, John Wiley & Sons, Inc., dated 1980, p. 65.

* cited by examiner

US 9,548,292 B2

CIRCUIT INCLUDING A RESISTIVE ELEMENT, A DIODE, AND A SWITCH AND A METHOD OF USING THE SAME

CROSS-REFERENCE OF THE INVENTION

This application is a divisional of and claims priority under 35 U.S.C. §120 to U.S. patent application Ser. No. 13/612,357 entitled "Semiconductor Device" by Otake et al., filed Sep. 12, 2012, which claims priority from Japanese Patent Application No. 2011-210198, filed Sep. 27, 2011, both applications of which are assigned to the current assignee hereof and incorporated herein by reference in their entireties.

BACKGROUND OF THE INVENTION

Field of the Invention

The disclosure relates to circuits that include resistive elements, diodes, and switches and method of using the circuits.

Description of the Related Art

Conventionally, for addressing ESD, various types of semiconductor devices having protection circuits for the semiconductor devices are proposed. For example, typically as shown in FIG. 7, an internal circuit 56 is protected by connecting a PN junction diode 52 between an input output terminal 50 and a power supply line 51, connecting a PN junction diode 54 between the input output terminal 50 and a ground line 53, and connecting a PN junction diode 55 between the power supply line 51 and the ground line 53. The ESD is an abbreviation of Electro-Static Discharge and means the discharge of static electricity.

However, as the miniaturization of elements is enhanced for a demand for higher speed and so on, the electrostatic breakdown tolerance of a semiconductor device is decreased and thus a more proper ESD protection element is essential. Japanese Patent Application publication No. 2006-128293 discloses a BiCMOS type integrated circuit including a MOS type transistor as a high breakdown voltage element and an NPN bipolar transistor as a low breakdown voltage element, which uses the low breakdown voltage NPN transistor as the ESD protection element, its problem, and a means of solving the problem.

Furthermore, Japanese Patent Application Publication No. Hei 05-90481 discloses using an NPN bipolar transistor between a power supply line and a ground line as an ESD protection element instead of using a PN junction diode, in which the base and emitter are connected by a resistor. Japanese Patent Application Publication No. Hei 06-177328 discloses using a MOS type transistor as an ESD protection element of which the snapback voltage is decreased so as to enhance the ESD protection characteristic.

Although details will be described below, the snapback voltage means a trigger voltage to start discharging static electricity to a ground line when a surge voltage by large static electricity is applied to an input output terminal or the like. When the snapback voltage of a protection element is lower than the snapback voltage of an element to be protected, static electricity is discharged to the ground line through the protection element, and the element to be protected is protected from the static electricity.

Japanese Patent Application Publication No. Hei 05-90481 discloses an additional ESD protection element 59 as shown in FIG. 8 in the same structure as the structure shown in FIG. 7 for a case in which static electricity is applied between a highest potential terminal as a power supply line 51 and a lowest potential terminal as a ground line 53. Conventionally, a parasitic PN junction diode 55a shown by a dotted line which uses the N type epitaxial layer as the cathode and uses the P type semiconductor substrate as the anode becomes a discharge path of static electricity applied between both the terminals and protects an internal circuit 56. The parasitic PN junction diode 55a is a replacement of the PN junction diode 55 in FIG. 7.

However, since the enhancement of miniaturization and so on cause the increase of the impedance of the discharge path of static electricity and so on, the parasitic PN junction diode 55a does not effectively work and a discharge path of static electricity occurs through some junction in the internal circuit 56, thereby causing a problem of breaking the junction in the internal circuit 56. Therefore, for addressing static electricity, the additional ESD protection element 59 is provided in which an NPN bipolar transistor 57 of which the base and emitter are shunted by a resistor 58 is connected in parallel with the parasitic PN junction diode 55a.

When a positive voltage by static electricity is applied from the power supply line 51 to the collector of the NPN bipolar transistor 57 connected to the power supply line 51 and a negative voltage is applied from the ground line 53 to the emitter connected to the ground line 53, the NPN bipolar transistor 57 breaks down at the time when the voltage reaches a collector-emitter breakdown voltage $BV_{CER}$ or more in the state where the resistor 58 is connected between the base and emitter of the NPN bipolar transistor 57. On the contrary, when static electricity is applied as a negative voltage to the power supply line 51 and as a positive voltage to the ground line 53, the base-collector junction is forward-biased through the resistor 58 and clamped.

Therefore, the internal circuit 56 between the power supply line 51 and the ground line 53 is protected from static electricity by the additional ESD protection element 59 which is formed by the NPN bipolar transistor 57 and the resistor 58, is connected in parallel with the conventional parasitic ESD protection PN junction diode 55a, and has a lower breakdown voltage. A portion of the discharge path of static electricity lies inside the semiconductor substrate, and other portion lies on the surface of the semiconductor substrate.

However, a semiconductor device used in a mobile phone or the like which requires a lower voltage operation needs other ESD protection element which breaks down by a still lower voltage and forms a static electricity discharge path such that a more portion of the path lies inside the semiconductor substrate for heat radiation when static electricity is applied.

SUMMARY OF THE DISCLOSURE

A semiconductor device can include a semiconductor substrate of a first general conductivity type, an epitaxial layer of a second general conductivity type formed on the semiconductor substrate, a first buried layer of the second general conductivity type formed between the semiconductor substrate and the epitaxial layer, a second buried layer of the first general conductivity type connected to a peripheral edge region of the first buried layer and extending from inside the semiconductor substrate into the epitaxial layer, a drawing layer of the first general conductivity type extending from a surface portion of the epitaxial layer into the epitaxial layer so as to be connected to the second buried layer, and a first diffusion layer of the second general conductivity type extending from a surface portion of the epitaxial layer into the epitaxial layer so as to be surrounded by the second buried layer and the drawing layer in plan view of the semiconductor substrate. The first buried layer covers a bottom portion of the first diffusion layer. The device also includes a second diffusion layer of the first general conductivity type connected to and surrounding the first diffusion layer in the plan view, a cathode electrode connected to the first diffusion layer and the second diffusion layer, and an anode electrode connected to the drawing layer. The first buried layer and the second buried layer are configured to form a PN junction diode, the second diffusion layer, the epitaxial layer and the drawing layer are configured to form a parasitic bipolar transistor, and the PN junction diode and the parasitic bipolar transistor are configured to form an ESD protection element.

As a modification of this device, the second diffusion layer may be extended deeper than the first diffusion layer so that the second buried layer can be part of the parasitic bipolar transistor. In another modification, the polarities of the first and second diffusion layers may be switched and the first diffusion layer may be extended deeper than the second diffusion layer so that the first diffusion layer and the second buried layer can be part of the parasitic transistor.

DETAILED DESCRIPTION OF THE INVENTION

Figure 1A:
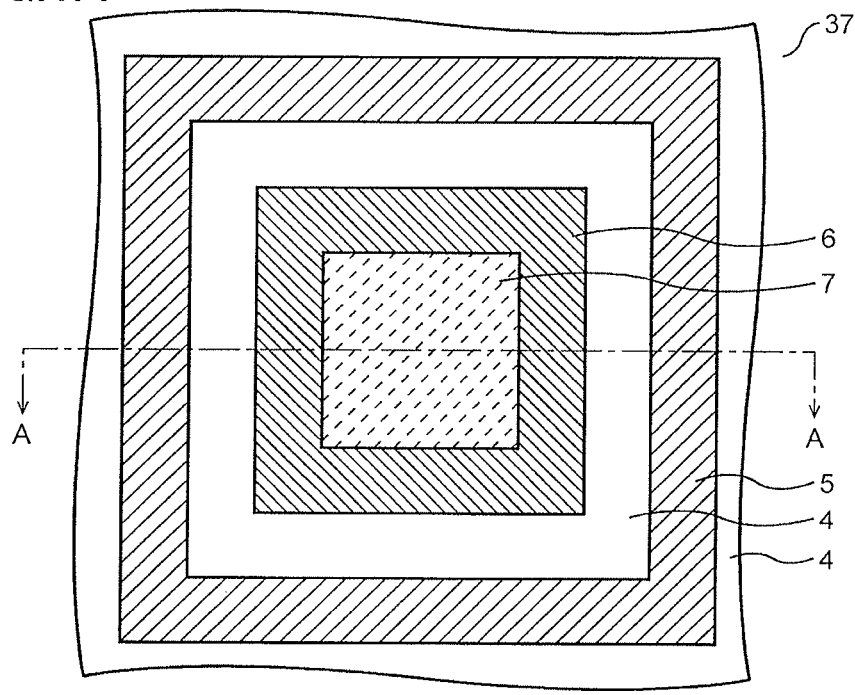
FIGS. 1A and 1B are a plan view of an ESD protection element and a cross-sectional view schematically showing a method of manufacturing the ESD protection element and the discharge path of static electricity.
Figure 1B:
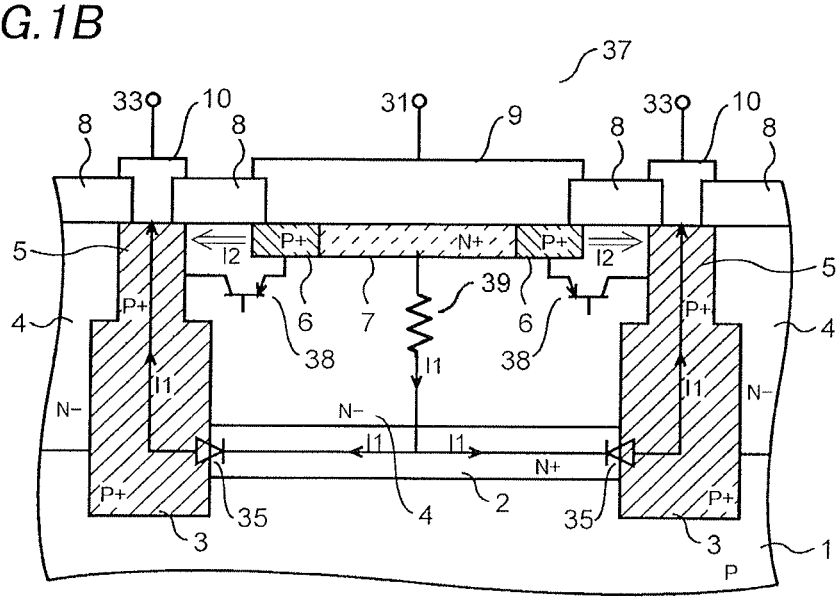

The feature of an ESD protection element 37 used in a semiconductor device of an embodiment will be described below referring to FIGS. 1A, 1B, 2A and 2B. FIG. 1A is a plan view of the ESD protection element 37 of the embodiment. FIG. 1B is a cross-sectional view of FIG. 1A along line A-A, and also a schematic diagram of the discharge path of static electricity. It is noted that a cathode electrode 9 and an anode electrode 10 shown in FIG. 1B are omitted in FIG. 1A.

Figure 2A:
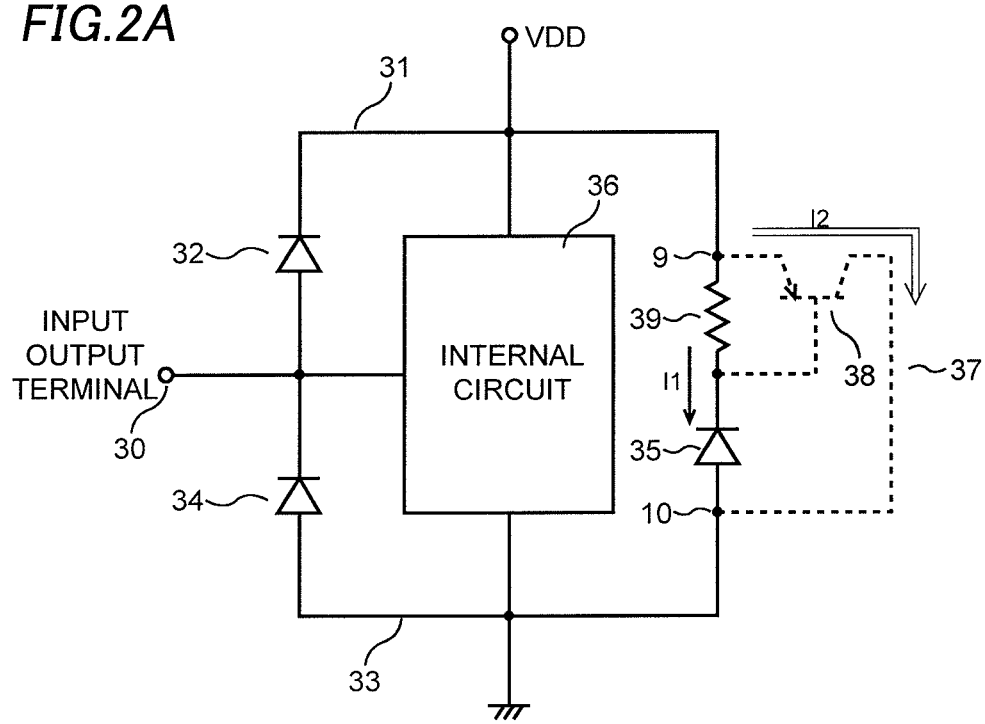
FIGS. 2A and 2B are a circuit diagram of an ESD protection circuit using the ESD protection element and a graph showing a relation of a voltage of static electricity applied to the ESD protection element and a discharge current.

FIG. 2A is a circuit diagram of an ESD protection circuit in which the ESD protection element 37 of the embodiment is connected between a power supply line 31 and a ground line 33. An internal circuit 36 is connected between the power supply line 31 and the ground line 33. An input output terminal 30 is drawn from the internal circuit 36, and a PN junction diode 32 is connected between the input output terminal 30 and the power supply line 31 and a PN junction diode 34 is connected between the input output terminal 30 and the ground line 33 as ESD protection elements. It is noted that the PN junction diodes 32 and 34 may be replaced by the structure of the ESD protection element 37.

The ESD protection element 37 is formed by a PN junction diode 35, a resistor 39 and a parasitic PNP bipolar transistor 38 shown by a dotted line, as shown in FIG. 2A. As shown in FIG. 1B, the PN junction diode 35 is formed by an N+ type buried layer 2 and a P+ type buried layer 3. The resistor 39 is formed by the resistance of an N− type epitaxial layer 4. The parasitic PNP bipolar transistor 38 is formed by a P+ type diffusion layer 6 as the emitter, the N− type epitaxial layer 4 as the base and a P+ type drawing layer 5 as the collector. It is noted that conductivity types such as N+, N and N− belong in one general conductivity type and conductivity types such as P+, P and P− belong in the other general conductivity type.

The structure of the ESD protection element 37 will be described in more detail referring to FIGS. 1A and 1B, and then the discharge path of static electricity applied to the ESD protection element 37 will be described.

As shown in FIG. 1B, the N+ type buried layer 2 and the P+ type buried layer 3 are connected to each other on the P type semiconductor substrate 1, and form the PN junction diode 35. The impurity concentration of the N+ type buried layer 2 at least in a region adjacent to the PN junction is higher than the concentration of the N− type epitaxial layer 4, but lower than the concentrations of a high concentration N+ type buried layer as the collector layer of an ordinary NPN bipolar transistor and the P+ type buried layer 3 of the embodiment. This is to set the breakdown voltage of the PN junction diode 35 formed by the N+ type buried layer 2 and the P+ type buried layer 3 to a desired value.

The P+ type buried layer 3 and the P+ type drawing layer 5 are combined and penetrate the N− type epitaxial layer 4, and are connected to the anode electrode 10 connected to the ground line 33. An N+ type diffusion layer 7 and the P+ type diffusion layer 6 adjacent to the N+ type diffusion layer 7 are formed from a surface portion of the N− type epitaxial layer 4 surrounded by the P+ type buried layer 3 and the P+ type drawing layer 5 which are shown on the left and right sides in FIG. 1B, and the N+ type buried layer 2.

As shown in FIG. 1A, in the N− type epitaxial layer 4 surrounded by the P+ type drawing layer 5 etc., the N+ type diffusion layer 7 is formed, and the P+ type diffusion layer 6 is formed adjacent to the N+ type diffusion layer 7 so as to surround the N+ type diffusion layer 7. As shown in FIG. 1B, the P+ type diffusion layer 6 is formed so as to have the same depth as the N+ type diffusion layer 7 from the surface of the N− type epitaxial layer 4.

The anode electrode 10 connected to the P+ type drawing layer 5 and the cathode electrode 9 connected to the N+ type diffusion layer 7 and the P+ type diffusion layer 6 are formed through the openings of an insulation film 8 made of a silicon oxide film or the like formed on the surface of the P type semiconductor substrate 1 including on the N+ type diffusion layer 7. The cathode electrode 9 is connected to the power supply line 31.

A discharge current and the discharge path of the discharge current when static electricity is applied to the ESD protection element 37 of the embodiment will be described hereafter referring to FIGS. 1B, 2A and 2B.

When a surge voltage by positive static electricity is applied to the power supply terminal $V_{DD}$ shown in FIG. 2A, the surge voltage by the positive static electricity is applied to the N+ type buried layer 2 from the power supply line 31 connected to the power supply terminal $V_{DD}$ through the cathode electrode 9, the N+ type diffusion layer 7 and the N− type epitaxial layer 4 as shown in FIG. 1B. On the other hand, the anode electrode 10 connected to the ground line 33, and the P+ type drawing layer 5 and the P+ type buried layer 3 connected to the anode electrode 10 have the ground potential.

Therefore, when the surge voltage by the positive static electricity is larger than the breakdown voltage of the PN junction diode 35 formed by the N+ buried layer 2 and the P+ buried layer 3, the PN junction diode 35 breaks down. This is because the breakdown voltage of the PN junction diode 35 is smaller than the breakdown voltage of the device forming the internal circuit 36 by setting the impurity concentration of the N+ type buried layer 2 higher than the impurity concentration of the N− type epitaxial layer 4 and lower than the impurity concentration of the adjacent P+ type buried layer 3.

As a result, as shown in FIG. 1B, a discharge current I1 flows from the N+ type diffusion layer 7 into the anode electrode 10 through the N− type epitaxial layer 4 having a resistance component, the N+ type buried layer 2, the P+ type buried layer 3 and the P+ type drawing layer 5. To describe this with FIG. 2B, the PN junction diode 35 breaks down at the voltage a, and the discharge current I1 flows with a gradient corresponding to the resistance of the N− type epitaxial layer 4 etc. until it reaches the voltage b.

When the discharge current I1 flows through the N− type epitaxial layer 4 as the resistor 39, a potential gradient occurs in the N− type epitaxial layer 4, and the potential of the N− type epitaxial layer 4 becomes lower than the potential of the high potential P+ type diffusion layer 6 connected to the cathode electrode 9. Therefore, the parasitic PNP bipolar transistor 38 which uses the P+ type diffusion layer 6 as the emitter, the N− type epitaxial layer 4 as the base and the P+ type drawing layer 5 as the collector turns on.

A large discharge current I2 flows through the on-state parasitic PNP bipolar transistor 38 from the P+ type diffusion layer 6 as the emitter to the P+ type drawing layer 5 as the collector as shown in FIG. 1B. Therefore, by the large discharge current I2 flowing through the parasitic PNP bipolar transistor 38, the positive static electricity entering from the power supply line 31 into the cathode electrode 9 flows from the P+ type diffusion layer 6 into the ground line 33 through the N− type epitaxial layer 4, the P+ type drawing layer 5 and the anode electrode 10. As a result, the internal circuit 36 is protected from the static electricity immediately.

Figure 2B:
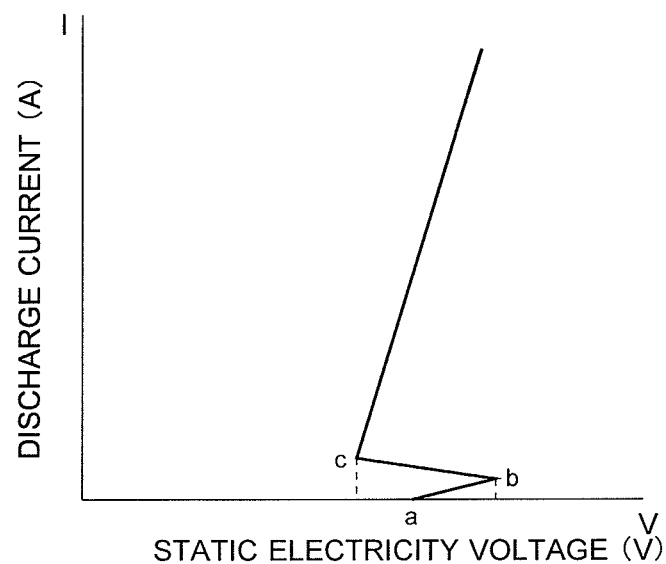

To describe this with FIG. 2B, at the time when the discharge current I1 flows and the voltage of the cathode electrode 9 reaches the voltage b, i.e., at the time when the potential difference between the P+ type diffusion layer 6 and the N− type epitaxial layer 4 reaches a predetermined value, the parasitic PNP bipolar transistor 38 turns on. The snapback phenomenon occurs at this time, then the collector-emitter voltage $V_{CE}$ of the parasitic PNP bipolar transistor 38 decreases to the voltage c, and then the discharge current I2 increases with a gradient corresponding to the collector resistance of the parasitic PNP bipolar transistor 38 etc. The voltage c substantially corresponds to $BV_{CER}$ which is the breakdown voltage of the parasitic bipolar transistor 38 when the emitter and base are shunted by a resistor R.

To describe this with FIG. 2A, in the ESD protection element 37, first, the PN junction diode 35 breaks down due to the surge voltage by the positive static electricity applied to the PN junction diode 35 from the power supply line 31 through the cathode electrode 9 and the resistor 39, and the discharge current I1 flows between the power supply line 31 and the ground line 33. As a result, a voltage decrease occurs at the resistor 39 and the base potential of the parasitic PNP bipolar transistor 38 decreases to become lower than the emitter potential, and thus the parasitic PNP bipolar transistor 38 turns on to flow the large discharge current I2 from the power supply line 31 into the ground line 33.

As described above, the feature of the ESD protection element 37 of the embodiment is that the internal circuit 36 is immediately protected from static electricity by realizing a desired breakdown voltage of the PN junction diode 35 by forming the PN junction diode 35 using the N+ type buried layer 2 having a predetermined impurity concentration and the P+ type buried layer 3 and by turning on the parasitic PNP bipolar transistor 38 using the discharge current I1 by the breakdown of the PN junction diode 35 to flow the large discharge current I2.

Hereafter, a method of manufacturing the ESD protection element of the embodiment will be briefly described referring to FIGS. 1B, 3A, 3B, 3C, 4A and 4B. Basically, the method is the same as a method of manufacturing a bipolar integrated circuit.

Figure 3A:
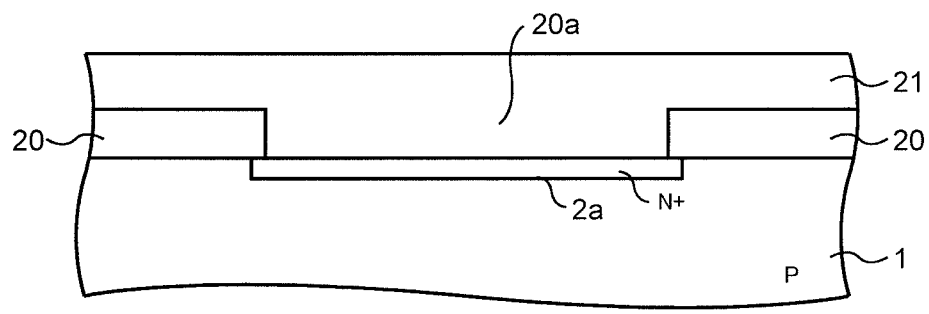
FIGS. 3A, 3B and 3C are cross-sectional views showing the method of manufacturing the ESD protection element.

First, as shown in FIG. 3A, the P type semiconductor substrate 1 is provided, and an insulation film 20 made of a silicon thermal oxide film or the like is formed on the surface. Then a predetermined size of opening 20a is formed in the insulation film 20 by a predetermined photo-etching process, and an antimony (Sb) doped coating film 21 is formed so as to cover the P type semiconductor substrate 1 including the opening 20a under the same condition as the condition for forming an N+ type buried layer in an ordinary bipolar process.

Then a heat treatment is performed to form an N+ type buried deposition layer 2a in the P type semiconductor substrate 1. The N+ type buried deposition layer 2a may be formed by ion-implanting antimony (Sb) or the like instead of using the coating film 21.

Figure 3B:
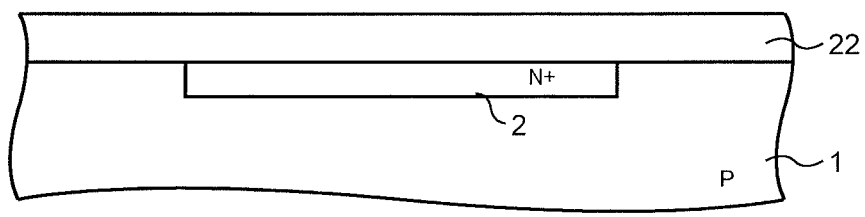

Then, as shown in FIG. 3B, after the coating film 21 is removed, a heat treatment is performed at temperature of about 1100° C. so as to diffuse the N+ type buried deposition layer 2a in the P type semiconductor substrate 1 in the lateral direction and in the downward direction into a deeper region, thereby forming the N+ type buried layer 2. At this time, a silicon oxide film 22 is formed on the P type semiconductor substrate 1 including on the N+ type buried layer 2.

Figure 3C:
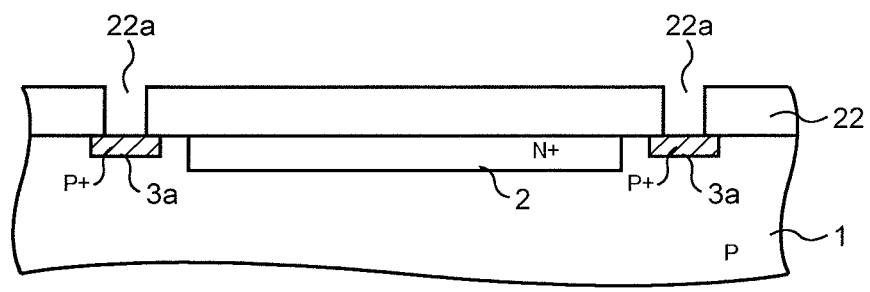

Then, as shown in FIG. 3C, an opening 22a is formed in the silicon oxide film 22 by a predetermined photo-etching process, and boron (B) or the like is ion-implanted or the like in the P type semiconductor substrate 1 exposed in the opening 22a using the silicon oxide film 22 etc. as a mask, thereby forming a P+ type buried deposition layer 3a.

Figure 4A:
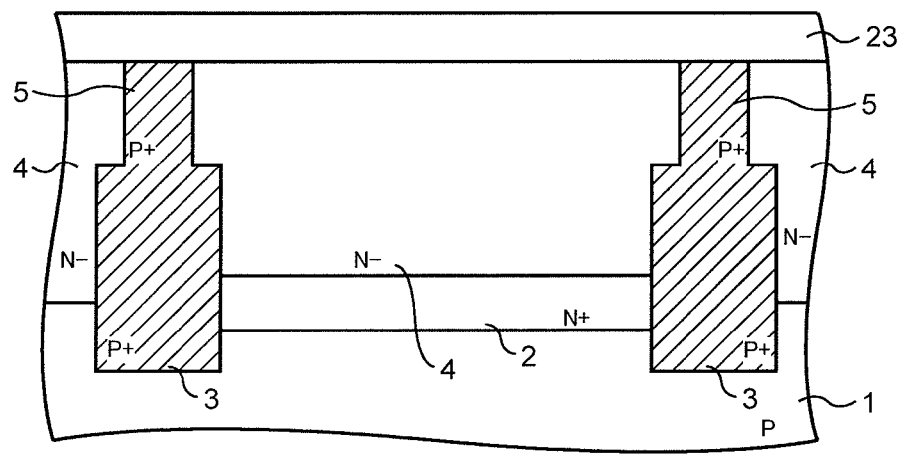
FIGS. 4A and 4B are cross-sectional views showing the method of manufacturing the ESD protection element.

Then, as shown in FIG. 4A, after the silicon oxide film 22 is removed, the N− type epitaxial layer 4 is deposited on the P type semiconductor substrate 1 including on the N+ buried layer 2 etc. by a predetermined epitaxial method. Then boron (B) or the like is ion-implanted in a predetermined position of the N− type epitaxial layer 4 or the like using a silicon oxide film etc. formed on the surface of the N− type epitaxial layer 4 as a mask, and a predetermined heat treatment is performed to form the combined P+ type buried layer 3 and P+ type drawing layer 5 penetrating the N− type epitaxial layer 4 as shown in FIG. 4A.

By the deposition of the N− type epitaxial layer 4 and the heat treatment after the deposition described above, the N+ type buried layer 2 is thermally diffused in the N− type epitaxial layer 4 to extend in the upward and lateral directions. However, the width of the diffusion is small since the diffusion coefficient of antimony (Sb) or the like forming the N+ type buried layer 2 is small. An insulation film 23 made of a silicon oxide film or the like is formed on the N− type epitaxial layer 4 including on the P+ type drawing layer 5.

The P+ type buried layer 3 diffused in the lateral direction at latest when the N− type epitaxial layer 4 is deposited or the heat treatment is performed after the deposition is connected to the end portion of the N+ type buried layer 2 having a low impurity concentration which is diffused in the lateral direction from the opening 20a in the P type semiconductor substrate 1 etc. in FIG. 3A, thereby forming the PN junction diode 35 having a desired breakdown voltage.

In detail, in the PN junction diode 35, the impurity concentration of a portion of the N+ type buried layer 2 adjacent to the PN junction is adjusted to a proper concentration by adjusting the distance between the end portion of the opening 20a shown in FIG. 3A and the end portion of the opening 22a shown in FIG. 3C. As a result, when a reverse bias is applied to the PN junction diode 35, the depletion layer extends more widely toward the N+ type buried layer 2 having a low impurity concentration, achieving the desired breakdown voltage.

It is also possible that the PN junction diode 35 is formed by the N+ type buried layer 2 having a low impurity concentration and the P+ type buried layer 3 by designing the N+ type buried layer 2 so as to have an impurity concentration lower than the impurity concentration of an N+ type buried layer in an ordinary bipolar process and lower than the impurity concentration of the P+ type buried layer 3 and by forming the N+ type buried layer 2 so as to overlap the P+ type buried layer 3 by an ion implantation process or the like. The desired breakdown voltage of the PN junction diode 35 is realized by setting the impurity concentration of the N+ type buried layer 2 having a low impurity concentration to a predetermined value, which is formed by the ion implantation process or the like in this region.

Furthermore, it is also possible to form an N+ type buried layer having a high impurity concentration equivalent to the impurity concentration of an N+ type buried layer of an ordinary bipolar process in a region away from the P+ type buried layer 3, and then form the described N+ type buried layer 2 having a low impurity concentration between the N+ type buried layer having a high impurity concentration and the P+ type buried layer 3 so as to connect these, thereby forming the PN junction diode 35 by the N+ type buried layer 2 having a low impurity concentration and the P+ type buried layer 3.

In the embodiment, the misalignment of the masks for forming the opening 20a and the opening 22a may cause a variation of the breakdown voltages of the PN junction diodes 35. However, the case of forming the N+ type buried layer 2 overlapping the P+ type buried layer 3 by ion implantation or the like does not cause a phenomenon corresponding to the mask misalignment, and thus the variation of the breakdown voltages of the PN junction diodes 35 is moderated.

Figure 4B:
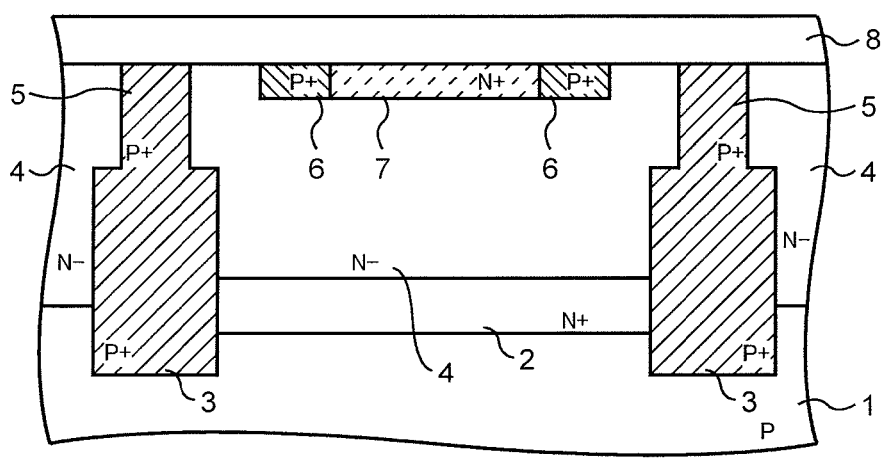

Then, as shown in FIG. 4B, the N+ type diffusion layer 7 and the P+ type diffusion layer 6 are formed sequentially by ion-implanting arsenic (As) or the like and boron (B) or the like using the insulation film 23 or a photoresist film as a mask by a predetermined method. This process is performed at the same time as when the emitter layer, the base contact layer, etc. of an ordinary bipolar transistor are formed. The insulation film 8 made of a silicon oxide film or the like is formed on the P type semiconductor substrate 1 including on the N+ type diffusion layer 7 etc.

Then, as shown in FIG. 1B, the anode electrode 10 connected to the P+ type drawing layer 5 and the cathode electrode 9 connected to the N+ type diffusion layer 7 and the P+ type diffusion layer 6 are formed in the insulation film 8 through the openings formed by a predetermined photo-etching process by performing a predetermined photo-etching process to a thin film made of aluminum (Al) or the like deposited by sputtering or the like. A multi-layer wiring structure is then formed according to need, and finally a passivation film is formed, thereby completing the semiconductor device having the ESD protection element 37.

Figure 5A:
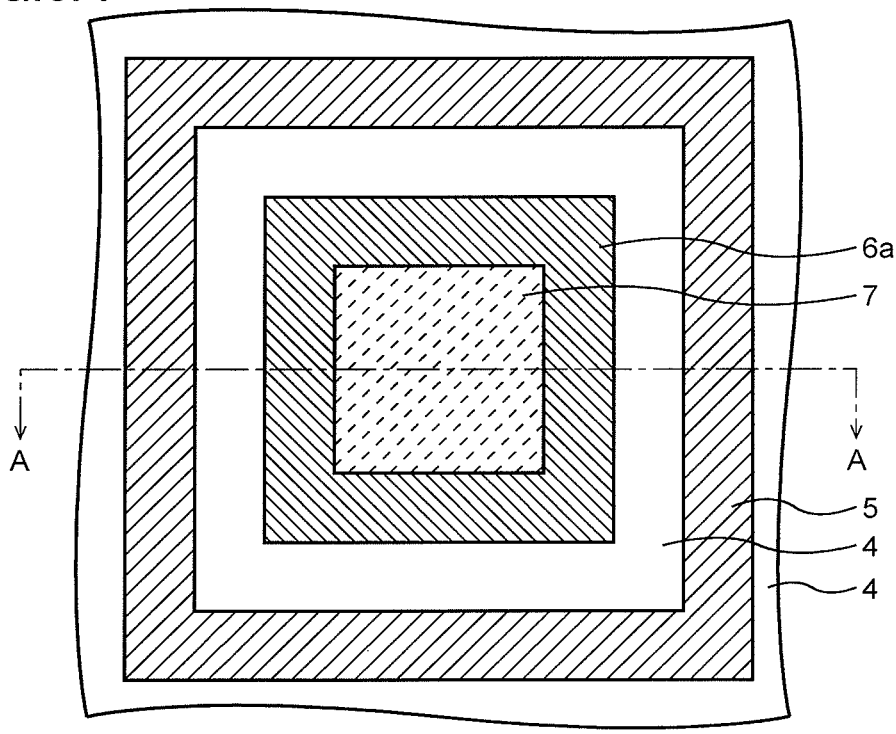
FIGS. 5A and 5B are a plan view of an ESD protection element of a first modification and a cross-sectional view schematically showing the discharge path of static electricity.
Figure 5B:
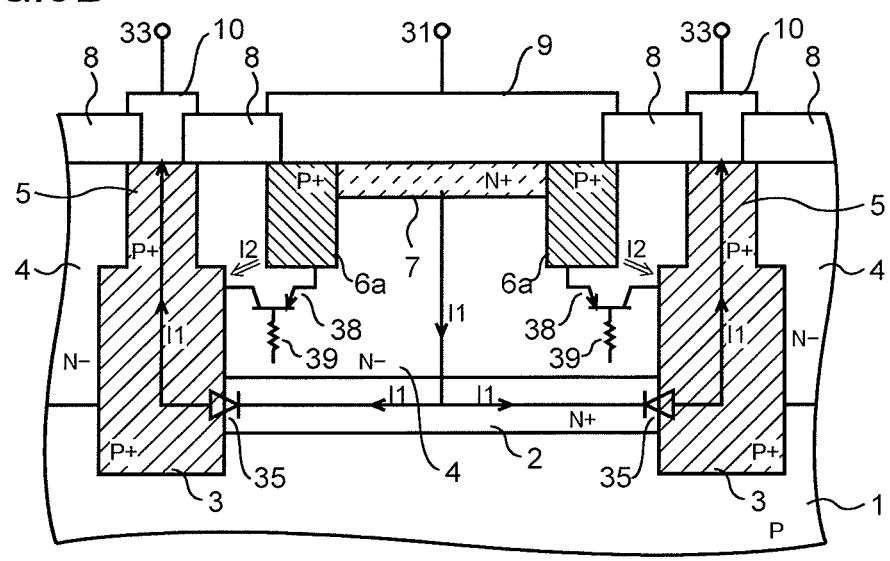

Next, an ESD protection element of a first modification of the embodiment will be described referring to FIGS. 5A and 5B. While the depth of the P+ type diffusion layer 6 in the N− type epitaxial layer 4 is almost the same as the depth of the N+ type diffusion layer 7 in the embodiment, a P+ type diffusion layer 6a is extended to a much deeper position than the N+ type diffusion layer 7 in the first modification, and this is the difference between the embodiment and the first modification. In FIGS. 5A and 5B, the P+ type diffusion layer 6a is formed at the same time as when the P+ type drawing layer 5 is formed, and is extended to the same depth as the depth of the P+ type drawing layer 5. The other structure is the same as that of the embodiment.

With this structure, as shown in FIG. 5B, the discharge current I2 of the parasitic PNP bipolar transistor 38 flows from the deeper region of the P+ type diffusion layer 6a into the P+ type buried layer 3 etc. through the deeper region of the N− type epitaxial layer 4. This is because the potential of the N− type epitaxial layer 4 becomes lower around the deeper region of the P+ type diffusion layer 6a, and the potential difference between the N− type epitaxial layer 4 and the P+ type diffusion layer 6a becomes larger.

Since the large discharge current I2 of the parasitic PNP bipolar transistor 38 flows through the deeper region of the N− type epitaxial layer 4 nearer the back surface of the semiconductor device, the heat radiation effect is enhanced and the thermal destruction does not easily occur, compared with the device of the embodiment. Therefore, the discharge current I2 is larger and the internal circuit 36 is protected from static electricity more immediately. From this point of view, it is preferable that the P+ type diffusion layer 6 is extended to a deeper position in the N− type epitaxial layer 4.

Figure 6A:
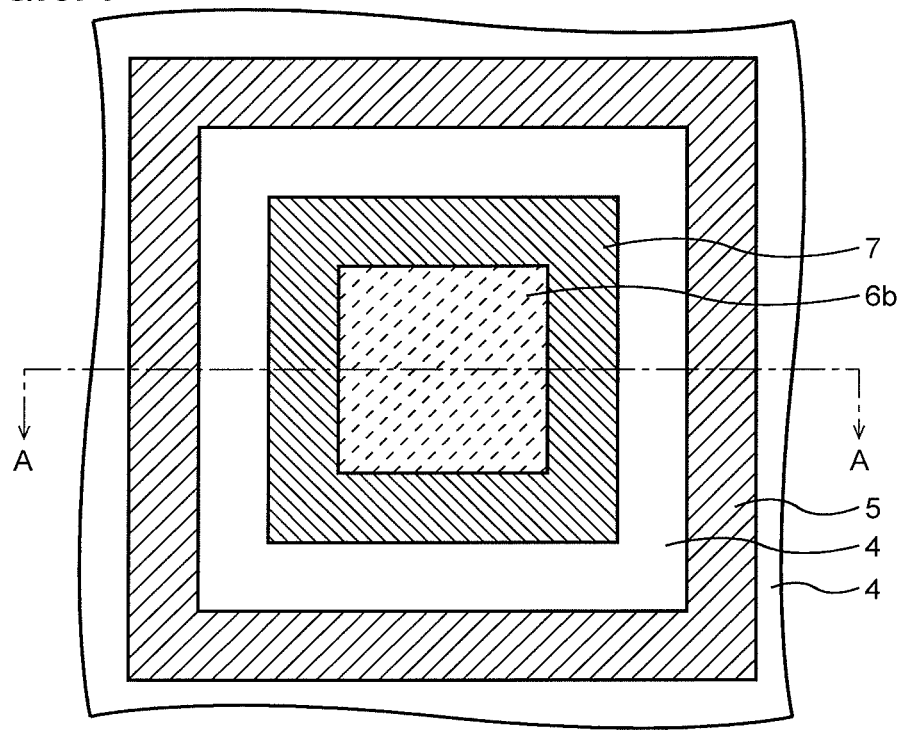
FIGS. 6A and 6B are a plan view of an ESD protection element of a second modification and a cross-sectional view schematically showing the discharge path of static electricity.
Figure 6B:
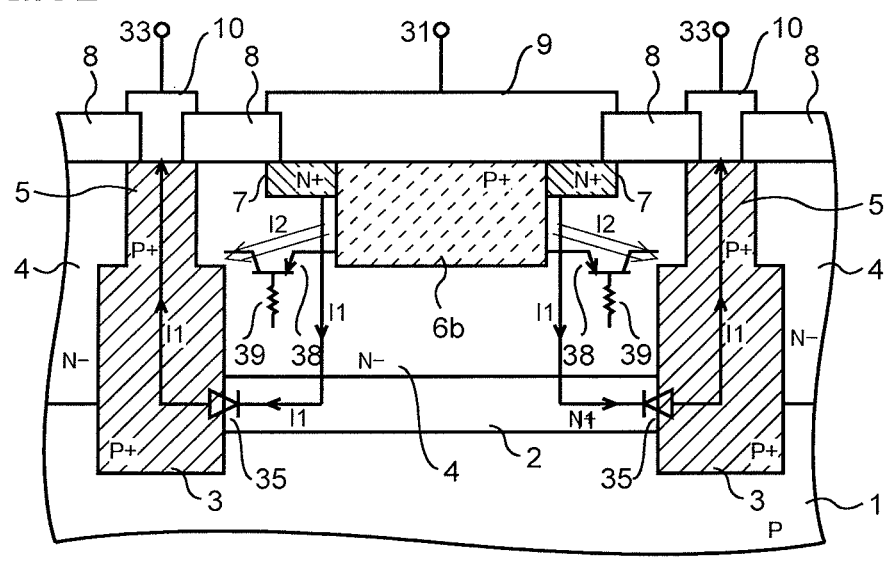
Figure 7:
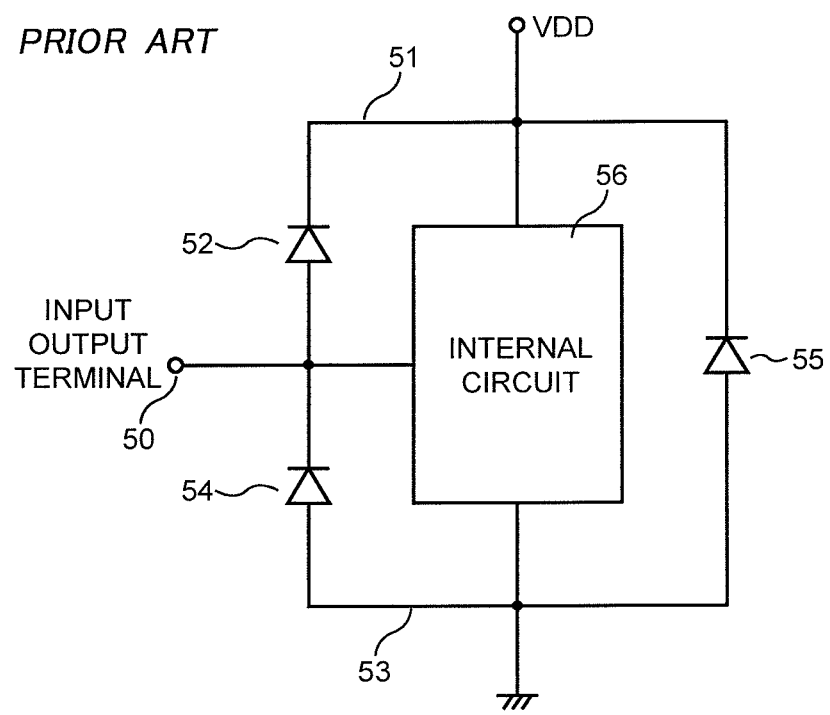
FIG. 7 is a circuit diagram of an ESD protection circuit using an ordinary PN junction diode as a conventional ESD protection element.
Figure 8:
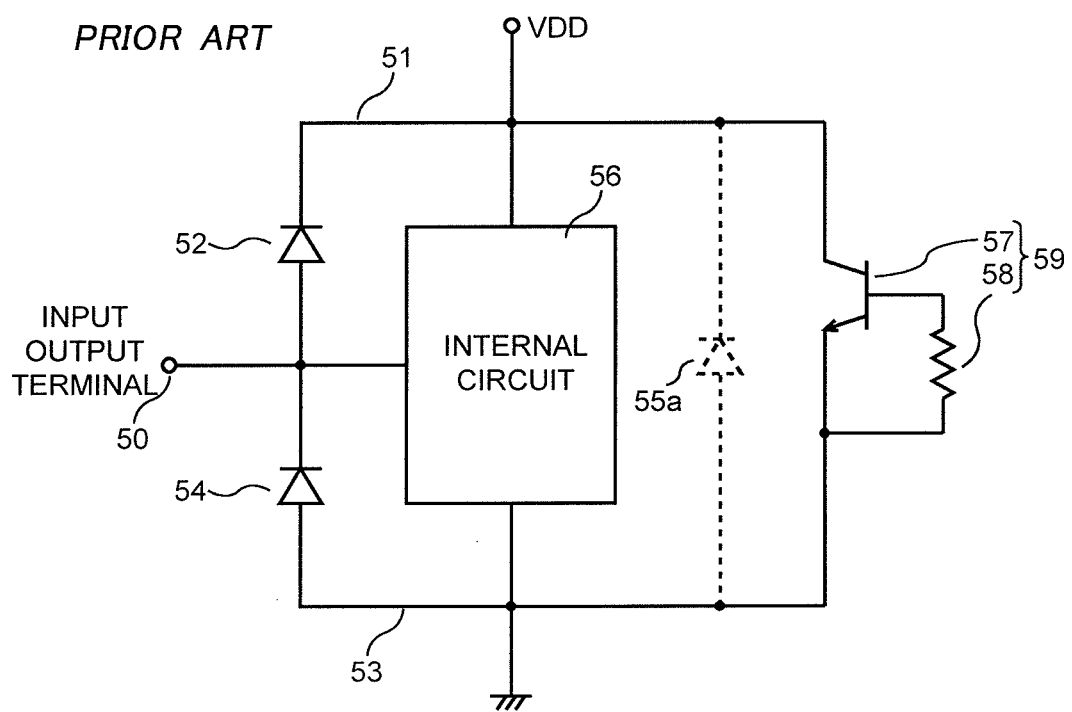
FIG. 8 is a circuit diagram of an ESD protection circuit using an additional ESD protection element formed by an NPN bipolar transistor and a resistor as well as an ordinary PN junction diode as a conventional ESD protection element.

An ESD protection element of a second modification of the embodiment will be described referring to FIGS. 6A and 6B. While the N+ type diffusion layer 7 is surrounded by the P+ type diffusion layer 6a in the first modification as shown in FIG. 5A, a P+ type diffusion layer 6b is surrounded by the N+ type diffusion layer 7 in the second modification as shown in FIG. 6A. This is the difference between the first modification and the second modification.

With this structure, by the discharge current I1 flowing from the N+ type diffusion layer 7 toward the N+ type buried layer 2, a potential difference occurs between the P+ type diffusion layer 6b and the N− type epitaxial layer 4 adjacent to the P+ type diffusion layer 6b. Since the potential difference becomes larger in the deeper region of the P+ type diffusion layer 6b, the discharge current I2 in the deeper region becomes larger and also the discharge current I2 flows from the shallower portion of the P+ type diffusion layer 6b. As a result, the total amount of the discharge current I2 becomes larger than in the first modification.

In the case of the first modification shown in FIGS. 5A and 5B, too, a potential difference occurs between the P+ type diffusion layer 6a and the N− type epitaxial layer 4 under the N+ diffusion layer 7 adjacent to the P+ type diffusion layer 6a. Since this potential difference becomes larger in the deeper region of the P+ type diffusion layer 6a, the discharge current 2 is larger in the deeper portion. Even in the shallower portion, too, the parasitic PNP bipolar transistor turns on.

However, the P+ type buried layer 3 and the P+ type drawing layer 5 are disposed away from the shallow portion of the N− type epitaxial layer 4 under the N+ type diffusion layer 7 where a voltage decrease occurs. Therefore, the distance from the N− type epitaxial layer 4 in this portion to the P+ type buried layer 3 etc. as the collector is long. In other words, the base width is large. Therefore, the discharge current I2 from this portion is small.

Although the description of the embodiment etc. is given using one ESD protection element as shown in FIG. 1A etc., the same structures may be formed on the front, rear, left and right sides in these figures in a grid pattern so as to form an ESD protection element of which the discharge current I2 is further increased.

A semiconductor device can have an ESD protection element with a high ESD protection characteristic which breaks down by a desired breakdown voltage and flows a large discharge current.

What is claimed is:

1. An integrated circuit comprising:
a substrate;
a resistor having a first terminal, a second terminal, and a resistive body between the first and second terminals, wherein:
the first terminal includes an N+ type diffusion layer adjacent to a first surface of an N− type epitaxial layer and is coupled to a first power supply terminal; and
the second terminal includes an N+ type buried layer that is adjacent to a second surface of the N− type epitaxial layer opposite the first surface of the N− type epitaxial layer;
a diode having an anode and a cathode, wherein the cathode includes the N+ type buried layer, and the anode includes a P+ type buried layer that abuts the N+ type buried layer;
a switch having a first current terminal, a second current terminal, and a control electrode, wherein the first current terminal includes a P+ type diffusion layer, the control electrode is coupled to the second terminal of the resistor and the cathode of the diode, wherein the second current terminal includes a P+ drawing layer that abuts the P+ type buried layer and is electrically connected to a second power supply terminal; and
a cathode electrode,
wherein:
a portion of the N− type epitaxial layer that includes the resistive body of the resistor and the control electrode of the switch is spaced apart from the substrate by the N+ type buried layer;
from a plan view at the first surface, the N+ type diffusion layer is completely surrounded by the P+ type diffusion layer, the P+ type diffusion layer is completely surrounded by the N− type epitaxial layer, and the portion of the N− type epitaxial layer is completely surrounded by the P+ type drawing layer; and
the cathode electrode directly contacts the P+ type diffusion layer and the N+ type diffusion layer.

2. The integrated circuit of claim 1, further comprising an internal circuit coupled to the first power supply terminal and the second power supply terminal, wherein a combination of the resistor, the diode, and the switch is an electrostatic discharge protection element.

3. The integrated circuit of claim 1, wherein the first current terminal of the switch is electrically connected to the first power supply terminal, and the second current terminal of the switch is electrically connected to the second power supply terminal.

4. The integrated circuit of claim 1, wherein the switch is a transistor.

5. The integrated circuit of claim 4, wherein the transistor is a PNP bipolar transistor.

6. The integrated circuit of claim 4, wherein the first current terminal is an emitter, and the second current terminal is a collector.

7. The integrated circuit of claim 6, wherein:
the diode comprises a junction between the N+ type buried layer and the P+ type buried layer;
the control electrode comprises a base of the transistor, and the base comprises a part of the portion of the N− type epitaxial layer adjacent to the first surface of the N− type epitaxial layer;
the collector comprises the P+ type drawing layer adjacent to the base and the first surface of the N− type epitaxial layer; and
the emitter comprises the P+ type diffusion layer adjacent to the base and the first surface of the N− type epitaxial layer, wherein the part of the portion of the N− type epitaxial layer is disposed between the P+ type drawing layer and the P+ type diffusion layer.

8. The integrated circuit of claim 7, wherein the resistive body corresponds to a thickness of the N− type epitaxial layer between the N+ type buried layer and the N+ type diffusion layer adjacent to the first surface.

9. The integrated circuit of claim 1, wherein the first power supply terminal is a $V_{DD}$ terminal, and the second power supply terminal is a ground terminal.

10. The integrated circuit of claim 1, wherein:
the first terminal of the resistor is electrically connected to the first power supply terminal; and
the control electrode of the switch is electrically connected to the second terminal of the resistor and the anode of the diode.

11. The integrated circuit of claim 1, wherein:
all of the N+ type diffusion layer is in superimposition over the N+ type buried layer and is laterally surrounded by the P+ type drawing layer.

12. A method of using an integrated circuit comprising:
providing the integrated circuit comprising:
a substrate;
a resistor having a first terminal, a second terminal, and a resistive body between the first and second terminals, wherein:
the first terminal includes an N+ type diffusion layer adjacent to a first surface of an N− type epitaxial layer and is coupled to a first power supply terminal; and the second terminal includes an N+ type buried layer that is adjacent to a second surface of the N− type epitaxial layer opposite the first surface of the N− type epitaxial layer;

a diode having an anode and a cathode, wherein the cathode includes the N+ type buried layer, and the anode includes a P+ type buried layer that abuts the N+ type buried layer;

a switch having a first current terminal, a second current terminal, and a control electrode, wherein the first current terminal includes a P+ type diffusion layer the control electrode is coupled to the second terminal of the resistor and the cathode of the diode, wherein the second current terminal includes a P+ type drawing layer that abuts the P+ type buried layer and is electrically connected to a second power supply terminal; and a cathode electrode, wherein:

a portion of the N− type epitaxial layer that includes the resistive body of the resistor and the control electrode of the switch is spaced apart from the substrate by the N+ type buried layer;

from a plan view at the first surface, the N+ type diffusion layer is completely surrounded by the P+ type diffusion layer, the P+ type diffusion layer is completely surrounded by the N− type epitaxial layer, and the portion of the N− type epitaxial layer is completely surrounded by the P+ type drawing layer; and the cathode electrode directly contacts the P+ type diffusion layer and the N+ type diffusion layer;

increasing a voltage of the first power supply terminal;

exceeding a breakdown voltage of the diode such that a first discharge current flows through the diode; and turning on the switch such that a second discharge current flows through the switch.

13. The method of claim 12, wherein turning on the switch occurs after a voltage difference across the diode is greater than the breakdown voltage of the diode.

14. The method of claim 12, wherein:

the first power supply terminal is electrically connected to the first current terminal of the switch; and the second power supply terminal is electrically connected to the second current terminal of the switch.

15. The method of claim 14, wherein the second discharge current is greater than the first discharge current.

16. The method of claim 14, wherein the switch is a transistor.

17. The method of claim 16, wherein:

the first terminal of the resistor and an emitter of the transistor are electrically connected to each other;

the second terminal of the resistor, the cathode of the diode, and a base of the transistor are electrically connected to one another; and the anode of the diode and a collector of the transistor are electrically connected to each other.

\* \* \* \* \*